(12) United States Patent
Kamiya et al.

(10) Patent No.: US 9,024,342 B2
(45) Date of Patent: May 5, 2015

(54) SEMICONDUCTOR LIGHT EMITTING ELEMENT

(75) Inventors: Masao Kamiya, Kiyosu (JP); Masashi Deguchi, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 127 days.

(21) Appl. No.: 13/200,927

(22) Filed: Oct. 5, 2011

(65) Prior Publication Data

US 2012/0138984 A1 Jun. 7, 2012

(30) Foreign Application Priority Data

Dec. 6, 2010 (JP) .................................. 2010-271602

(51) Int. Cl.
| | | |
|---|---|---|
| H01L 33/46 | (2010.01) | |
| H01L 33/38 | (2010.01) | |
| H01L 33/22 | (2010.01) | |

(52) U.S. Cl.
CPC .................. *H01L 33/38* (2013.01); *H01L 33/22* (2013.01); *H01L 33/46* (2013.01)

(58) Field of Classification Search
CPC ......... H01L 33/22; H01L 33/46; H01L 33/38; H01L 33/0079; H01L 33/405; H01L 2224/45144; H01L 2924/00014; B82Y 20/00
USPC ........................ 257/78, 98, 680, 95, E33.068
See application file for complete search history.

(56) References Cited

U.S. PATENT DOCUMENTS

| | | | |
|---|---|---|---|
| 6,410,942 B1 | 6/2002 | Thibeault et al. | |
| 6,657,236 B1 | 12/2003 | Thibeault et al. | |
| 2003/0141506 A1* | 7/2003 | Sano et al. ...................... | 257/78 |
| 2004/0041164 A1 | 3/2004 | Thibeault et al. | |
| 2005/0045894 A1* | 3/2005 | Okuyama et al. ............... | 257/95 |
| 2009/0206354 A1 | 8/2009 | Kitano et al. | |
| 2009/0278145 A1 | 11/2009 | Sakai | |
| 2010/0032701 A1 | 2/2010 | Fudeta | |
| 2010/0207146 A1 | 8/2010 | Iizuka et al. | |

(Continued)

FOREIGN PATENT DOCUMENTS

| | | |
|---|---|---|
| JP | 11-168236 A | 6/1999 |
| JP | 2004-511080 A | 4/2004 |

(Continued)

OTHER PUBLICATIONS

Japanese Notice of Grounds for Rejection dated Sep. 25, 2013, with partial English translation.

*Primary Examiner* — Kenneth Parker
*Assistant Examiner* — Bo Fan
(74) *Attorney, Agent, or Firm* — McGinn IP Law Group, PLLC

(57) ABSTRACT

A semiconductor light emitting element includes a semiconductor multilayer structure including a first conductive type layer, a second conductive type layer, and a light emitting layer sandwiched between the first conductive type layer and the second conductive type layer, and a reflecting layer formed on the second conductive type layer for reflecting the light emitted from the light emitting layer. The light is extracted in a direction from the light emitting layer toward the first conductive type layer. The first conductive type layer includes a concavo-convex region on a surface thereof not opposite to the light emitting layer, for changing a path of light, and at least a part of the reflecting layer is formed extending to right above an edge of the concavo-convex region.

5 Claims, 7 Drawing Sheets

(56) References Cited

U.S. PATENT DOCUMENTS

2011/0018024 A1* 1/2011 Fukshima et al. .............. 257/98
2012/0032144 A1 2/2012 Fudeta

FOREIGN PATENT DOCUMENTS

| | | | |
|---|---|---|---|
| JP | 2007-165409 A | 6/2007 |
| JP | 2008-288548 A | 11/2008 |
| JP | 2009-200178 A | 9/2009 |
| JP | 2010-040761 A | 2/2010 |
| JP | 2010-219502 A | 9/2010 |
| WO | WO 01/41219 A1 | 6/2001 |
| WO | WO 01/41225 A2 | 6/2001 |

* cited by examiner

SEMICONDUCTOR LIGHT EMITTING ELEMENT

The present application is based on Japanese patent application No. 2010-271602 filed on Dec. 6, 2010, the entire contents of which are incorporated herein by reference.

BACKGROUND OF THE INVENTION

1. Field of the Invention

This invention relates to a semiconductor light emitting element.

2. Description of the Related Art

A semiconductor light emitting element is known that includes a light emitting layer sandwiched between an n-type semiconductor layer and a p-type semiconductor layer on a substrate, wherein a light emitted from the light emitting layer is extracted through the substrate side. JP-A-2008-288548 discloses a semiconductor light emitting element that includes a reflecting layer for reflecting the light emitted from the light emitting layer in the direction opposite to the substrate and extracting the light from the substrate side so as to increase the amount of extracted light.

JP-T-2004-511080 discloses a semiconductor light emitting element that includes a concavity and convexity for changing the path of light formed on the surface of the substrate side of the n-type semiconductor layer.

SUMMARY OF THE INVENTION

It is an object of the invention to provide a semiconductor light emitting element that improves in light extraction efficiency while having the concavity and convexity on the surface of the semiconductor layer and the reflecting layer.
(1) According to one embodiment of the invention, a semiconductor light emitting element comprises:

a semiconductor multilayer structure comprising a first conductive (i.e., conductivity) type layer, a second conductive type layer, and a light emitting layer sandwiched between the first conductive type layer and the second conductive type layer a reflecting layer formed on the second conductive type layer for reflecting the light emitted from the light emitting layer, wherein the light is extracted in a direction from the light emitting layer toward the first conductive type layer, the first conductive type layer comprises a concavo-convex region on a surface thereof not opposite to the light emitting layer, for changing a path of light, and at least a part of the reflecting layer is formed extending to right above an edge of the concavo-convex region.

In the above embodiment (1) of the invention, the following modifications and changes can be made.

(i) The semiconductor light emitting element further comprises:

a translucent substrate that is in contact with the surface of the first conductive type layer with the concavo-convex region formed thereon.

(ii) At least a part of the semiconductor multilayer structure is formed extending to above an edge of the translucent substrate.

(iii) The semiconductor light emitting element further comprises:

an insulating layer formed between the reflecting layer and the second conductive type layer.

(iv) A side surface of a part of the reflecting layer formed right above an edge of the first conductive type layer is not covered with the insulating layer.

(v) The concavo-convex region is formed on a whole area of the surface of the first conductive type layer.

Effects of the Invention

According to one embodiment of the invention, a semiconductor light emitting element can be provided that improves in light extraction efficiency while having the concavity and convexity on the surface of the semiconductor layer and the reflecting layer.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment

Figure 1:
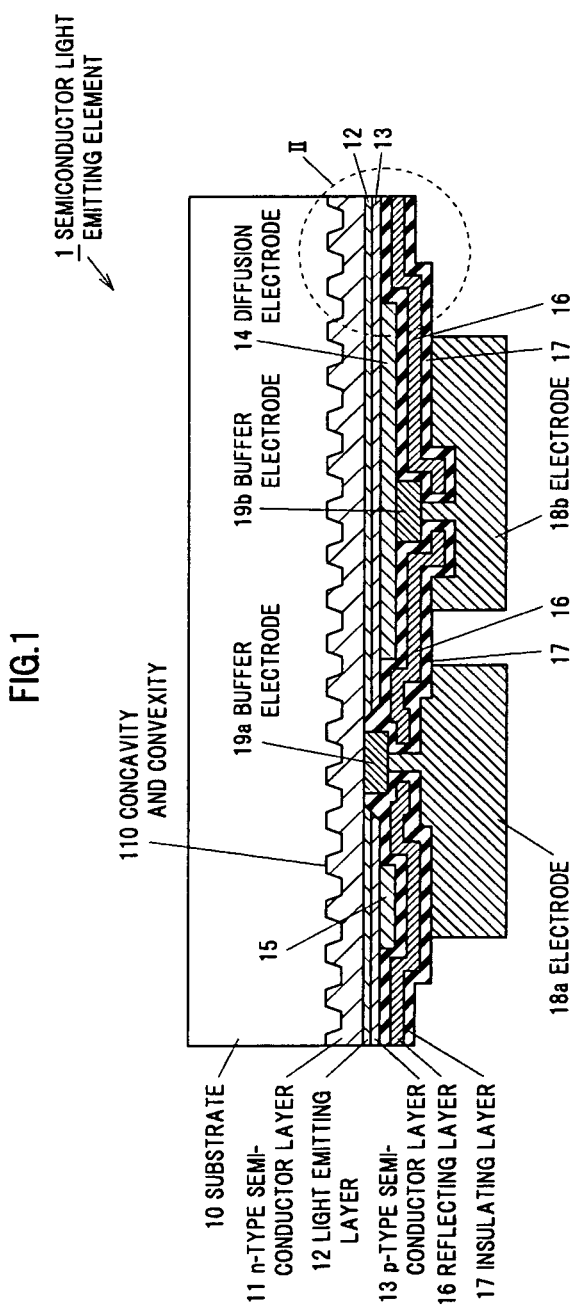
FIG. 1 is a vertical cross-sectional view schematically showing a semiconductor light emitting element according to a first embodiment of the invention.

FIG. 1 is a vertical cross-sectional view schematically showing a semiconductor light emitting element according to a first embodiment of the invention.

A semiconductor light emitting element 1 includes a semiconductor structure that has an n-type semiconductor layer 11, a p-type semiconductor layer 13 and a light emitting layer 12 sandwiched therebetween, and is a light emitting element of such a type that a light is extracted from the side of the n-type semiconductor layer 11 of the light emitting layer 12 at. A substrate 10 is formed on the surface of the n-type semiconductor layer 11 not opposite to the light emitting layer 12. A diffusion electrode 14 is formed on the p-type semiconductor layer 13. A reflecting layer 16 is formed on the p-type semiconductor layer 13 and the diffusion electrode 14 via an insulating layer 17.

Parts of the p-type semiconductor layer 13 and the light emitting layer 12 are removed by etching so as to expose a part of the n-type semiconductor layer 11, and an electrode 18a is connected to the exposed portion via a buffer electrode 19a. An electrode 18b is connected to the diffusion electrode 14 via a buffer electrode 19b. The electrode 18a, 18b are formed on the insulating layer 17.

The n-type semiconductor layer 11, the light emitting layer 12 and the p-type semiconductor layer 13 are respectively a layer of III group nitride compound semiconductor. As the III group nitride compound semiconductor, for example, a quaternary III group nitride compound semiconductor represented by a formula of $Al_xGa_yIn_{1-x-y}N$ (here, $0 \leq x \leq 1$, $0 \leq y \leq 1$, $0 \leq x+y \leq 1$) can be used.

In addition, the n-type semiconductor layer 11 has a concavity and convexity 110 for changing the path of light on the surface opposite to the light emitting layer 12. The concavity and convexity 110 has, for example, a dot pattern or a line and space pattern, and has a function that reduces total reflection of the light emitted from the light emitting layer 12 so as to increase an amount of light extracted of the semiconductor light emitting element 1. The concavity and convexity 110 is formed in the whole region or the partial region of the surface of the n-type semiconductor layer 11 opposite to the light emitting layer 12. The concavity and convexity 110 of the n-type semiconductor layer 11 is formed by, for example, growing a crystal on the substrate 10 having a concavity and convexity on the surface thereof so as to form the n-type semiconductor layer 11.

The n-type semiconductor layer 11 has a multilayer structure including, for example, an n-type contact layer, an n-type ESD layer and an n-type clad layer, and each layer is formed of an n-GaN that is respectively doped with a predetermined amount of an n-type dopant such as Si.

The light emitting layer 12 has a multiple quantum structure formed by including a plurality of quantum well layers and a plurality of barrier layers. The quantum well layer is formed of, for example, InGaN, and the barrier layer is formed of, for example, GaN, AlGaN or the like.

The p-type semiconductor layer 13 has a multilayer structure including, for example, a p-type clad layer and a p-type contact layer, and each layer is formed of a p-GaN that is respectively doped with a predetermined amount of a p-type dopant such as Mg.

The substrate 10 is formed of a translucent material such as sapphire.

The n-type semiconductor layer 11, the light emitting layer 12 and the p-type semiconductor layer 13 are formed by, for example, growing a crystal on the substrate 10 by using Metal Organic Chemical Vapor Deposition (MOCVD) method, Molecular Beam Epitaxy (MBE) method, or Halide Vapor Phase Epitaxy (HVPE) method. It is preferable that the n-type semiconductor layer 11, the light emitting layer 12 and the p-type semiconductor layer 13 are formed on the whole surface of the substrate 10 in terms of ensuring a light emission region of the semiconductor light emitting element 1 widely.

The diffusion electrode 14 has a function that diffuses electrical current flowing from the electrode 18b to the p-type semiconductor layer 13 uniformly. In addition, it is preferable that the diffusion electrode 14 is transparent to the light emitted from the light emitting layer 12, and it is formed of, for example, Indium Tin Oxide (ITO). The diffusion electrode 14 is formed by, for example, patterning a conductive film by etching, the conductive film being formed by Vacuum Deposition method, Sputtering method or CVD method. Further, as shown in FIG. 1, the diffusion electrode 14 can include a region 15 to which the electrodes are not connected.

The insulating layer 17 is formed of an insulating material such as $SiO_2$, SiN. Also, as a material of the insulating layer 17, a metal oxide such as $TiO_2$, $Al_2O_3$, $Ta_2O_5$, or a resin material having an electrical insulation property such as polyimide can be used. The insulating layer 17 is formed by Vacuum Deposition method, Chemical Vapor Deposition (CVD) method or the like. Further, a part of a region of the insulating layer 17 on the buffer electrode 19a and a part of a region thereof on the buffer electrode 19 are removed by using a photolithography technique and an etching technique so as to form contact parts of the electrodes 18a, 18b to the buffer electrodes 19a, 19b.

The electrodes 18a, 18b has a multilayer structure formed of, for example, Ni/Au. The electrodes 18a. 18b can be formed by a Sputtering method or the like. In addition, the electrodes 18a, 18b can be formed in such a way that a pad part on the insulating layer 17 and a contact part in the insulating layer 17 are individually formed by using a different material.

The semiconductor light emitting element 1 is connected to a mounting board or the like via the electrodes 18a, 18b. Electrical voltage is applied to the n-type semiconductor layer 11 and the p-type semiconductor layer 13 via the electrodes 18a, 18b, thereby a light is emitted from the light emitting layer 12.

The reflecting layer 16 has a function that reflects the light emitted from the light emitting layer 12 in the direction of the p-type semiconductor layer 13 (in the direction opposite to the light extraction direction). The light reflected by the reflecting layer 16 can be extracted from the side of the n-type semiconductor layer 11, thus an amount of light extracted of the semiconductor light emitting element 1 can be increased.

The reflecting layer 16 is formed of a metal having a high reflectance to the light emitted from the light emitting layer 12 such as Al, Ag, Rh, Pt, or an alloy containing at least one of the metals as a main component. For the purpose of reflecting the light emitted from the light emitting layer 12 effectively, it is preferable that the reflecting layer 16 is formed on almost the whole surface of the semiconductor structure except for peripheries and the like of the contact parts of the electrodes 18a, 18b.

The reflecting layer 16 is formed up to right above the edge of the region of the n-type semiconductor layer 11 in which the concavity and convexity 110 is formed. In case that the concavity and convexity 110 is formed up to the edge of the n-type semiconductor layer 11, the reflecting layer 16 is formed up to right above the edge of the n-type semiconductor layer 11. In addition, it is preferable that the reflecting layer 16 is formed up to right above as many edges as possible of the concavity and convexity 110, and it is more preferable that the reflecting layer 16 is formed up to right above all edges of the concavity and convexity 110. In addition, a multilayer structure of the reflecting layer 16 and the insulating layer 17 is cut at the edge of the semiconductor multilayer structure in the manufacturing process, thus the side surface of a part of the reflecting layer 16, the part being located at right above the edges of the n-type semiconductor layer 11, may not be covered with the insulating layer 17 so as to be exposed.

Figure 2:
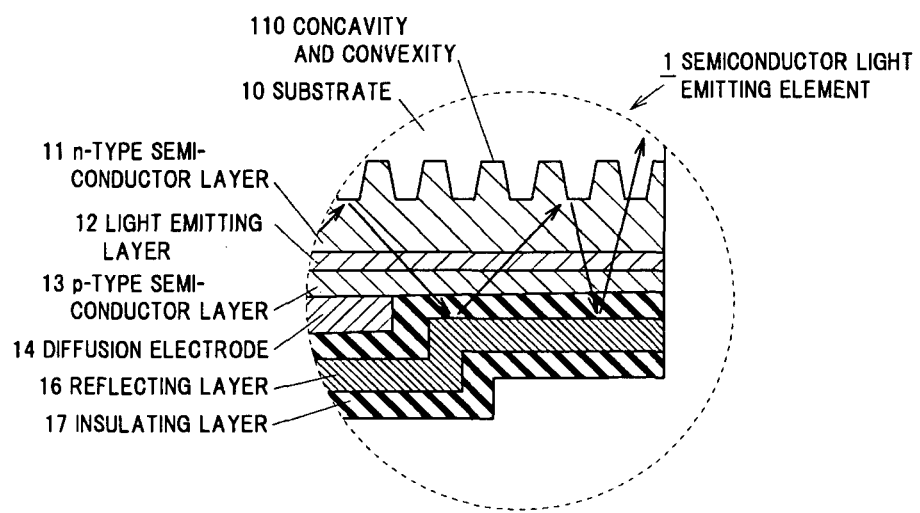
FIG. 2 is a partial enlarged view of a region II in FIG. 1.

FIG. 2 is a partial enlarged view of a region II in FIG. 1. Arrow marks in FIG. 2 schematically show an example of a locus of the light emitted from the light emitting layer 12. This light is a light that after emitted from the light emitting layer 12, carries out total reflection at the interface between the substrate 10 and the n-type semiconductor layer 11 so as to travel up to the edge of the semiconductor structure. The light may undergo the change of reflection angle due to the concavity and convexity 110, but the reflecting layer 16 is formed up to right above the edge of the concavity and convexity 110, thus even if the reflection angle is changed in the edge of the semiconductor structure, it is reflected by the reflecting layer 16 so as to be extracted from the side of the n-type semiconductor layer 11 of the light emitting layer 12.

Figure 3:
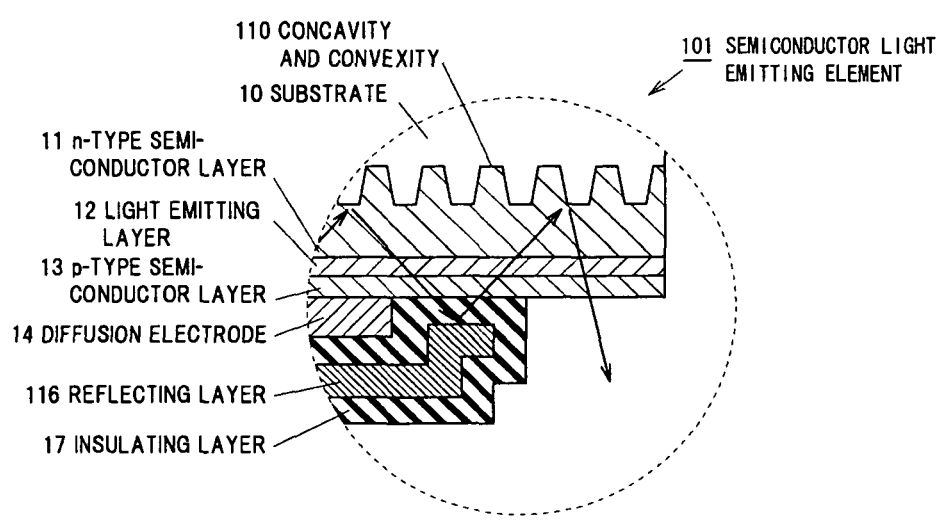
FIG. 3 is a partial enlarged view of a semiconductor light emitting element according to the comparative example of the invention.

FIG. 3 is a partial enlarged view of a semiconductor light emitting element 101 according to the comparative example of the invention. In the semiconductor light emitting element 101, the reflecting layer 26 is not formed up to right above the edge of the concavity and convexity 110 as well as the conventional light emitting element. In this case, the light of which reflection angle is changed in the edge of the semiconductor structure comes out of the side of the p-type semiconductor layer 13 of the light emitting layer 12. Thus, an amount of light extracted of the semiconductor light emitting element 101 according to the comparative example is smaller than that of the semiconductor light emitting element 1 according to the embodiment.

Figure 4:
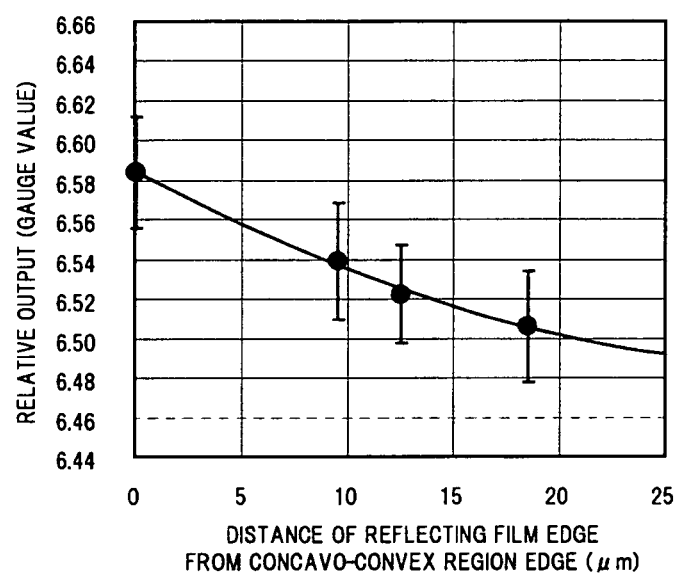
FIG. 4 is a graph showing a relationship between a distance of an edge of a reflecting film from an edge of a n-type semiconductor layer and a relative value (relative output) of an amount of light extracted.

FIG. 4 is a graph showing a relationship between a distance of the edge of the reflecting layer 16 from the edge of the n-type semiconductor layer 11 and a relative value (relative output) of an amount of light extracted. Here, the n-type semiconductor layer 11 has a shape of square, 346 μm on a side, and the distance of the edge of the reflecting layer 16 from the edge of the n-type semiconductor layer 11 is equal in all the regions. Namely, the reflecting layer 16 is shaped like a square, and becomes smaller according as the distance of the edge of the reflecting layer 16 from the edge of the n-type semiconductor layer 11 becomes larger.

As will be appreciated from FIG. 4, the smaller the distance of the edge of the reflecting layer 16 from the edge of the n-type semiconductor layer 11 is, the more the amount of light extracted increase. It is considered that this has been caused by that advantageous effects described above by using FIGS. 2 and 3 have been reflected. Further, the smaller the chip size is, the more the tendency becomes remarkable and the larger the effect of the embodiment becomes.

Second Embodiment

The semiconductor light emitting element 2 according to the second embodiment differs from the semiconductor light emitting element 1 according to the first embodiment in that the reflecting layer 16 is also used for a contact electrode of the p-type semiconductor layer 13. Further, an explanation about the same feature as that of the first embodiment will be omitted or simplified.

Figure 5:
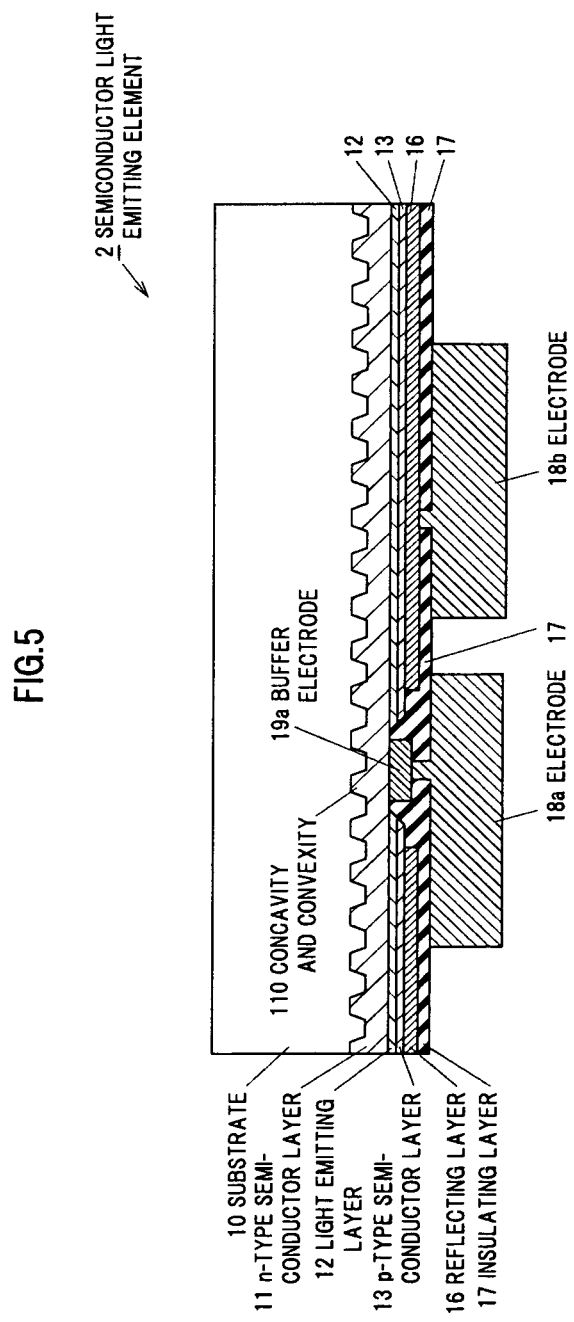
FIG. 5 is a vertical cross-sectional view schematically showing a semiconductor light emitting element according to a second embodiment of the invention.

FIG. 5 is a vertical cross-sectional view schematically showing a semiconductor light emitting element 2 according to the second embodiment of the invention. The semiconductor light emitting element 2 does not include the diffusion electrode 14 and the buffer electrode 19b of the semiconductor light emitting element 1. The reflecting layer 16 is formed directly on the p-type semiconductor layer 13 without the insulating layer 17 so as to be electrically connected to the p-type semiconductor layer 13. In addition, the electrode 18b is connected to the reflecting layer 16.

In the embodiment, the reflecting layer 16 is also used for the contact electrode of the p-type semiconductor layer 13, thus it is preferred to use a material having a high electrical conductivity such as Ag as a material of the reflecting layer 16.

Third Embodiment

The semiconductor light emitting element 3 according to the third embodiment differs from the semiconductor light emitting element 1 according to the first embodiment in that the substrate 10 is removed. Further, an explanation about the same feature as that of the first embodiment will be omitted or simplified.

Figure 6:
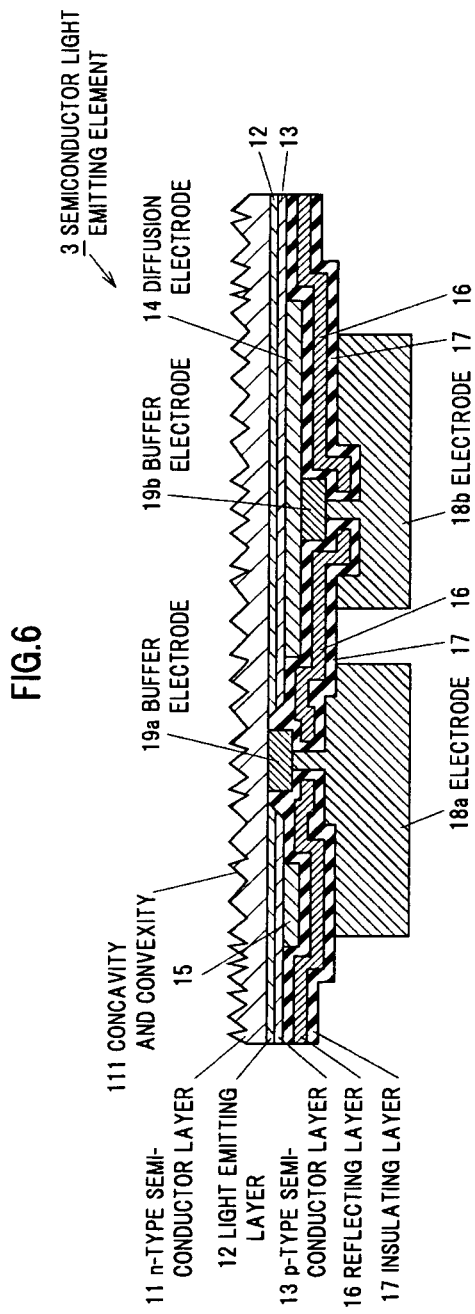
FIG. 6 is a vertical cross-sectional view schematically showing a semiconductor light emitting element according to a third embodiment of the invention.

FIG. 6 is a vertical cross-sectional view schematically showing a semiconductor light emitting element 3 according to the third embodiment of the invention. In the semiconductor light emitting element 3, a translucent substrate corresponding to the substrate 10 of the semiconductor light emitting element 1 is removed, and a concavity and convexity 111 is formed on the exposed surface of the n-type semiconductor layer 11. Further, the reflecting layer 16 can be formed directly on the diffusion electrode 14 without the insulating layer 17.

First, the n-type semiconductor layer 11, the light emitting layer 12, the p-type semiconductor layer 13, the diffusion electrode 14, the buffer electrodes 19a, 19b, the reflecting layer 16, the insulating layer 17 and the electrodes 18a, 18b are formed on the substrate 10. After that, the substrate 10 is separated from the n-type semiconductor layer 11 by using Laser Lift Off (LLO) method. In addition, the exposed surface of the n-type semiconductor layer 11 is immersed in a KOH aqueous solution, thereby the concavity and convexity 111 is formed on the surface of the n-type semiconductor layer 11.

According to the third embodiment, the translucent substrate is removed, and the concavity and convexity 111 with the irregular form is formed on the exposed surface of the n-type semiconductor layer 11, so that the total reflection of light emitted from the light emitting layer 12 can be reduced at the interface of the concavity and convexity 111 to increase the amount of light extracted.

Fourth Embodiment

The semiconductor light emitting element 4 according to the fourth embodiment differs from the semiconductor light emitting element 1 according to the first embodiment in that the substrate 10 is removed, the semiconductor structure is joined to a supporting substrate, and electrodes 28a, 28b are formed so as to sandwich the semiconductor light emitting element therebetween. Further, an explanation about the same feature as that of the first embodiment will be omitted or simplified.

Figure 7:
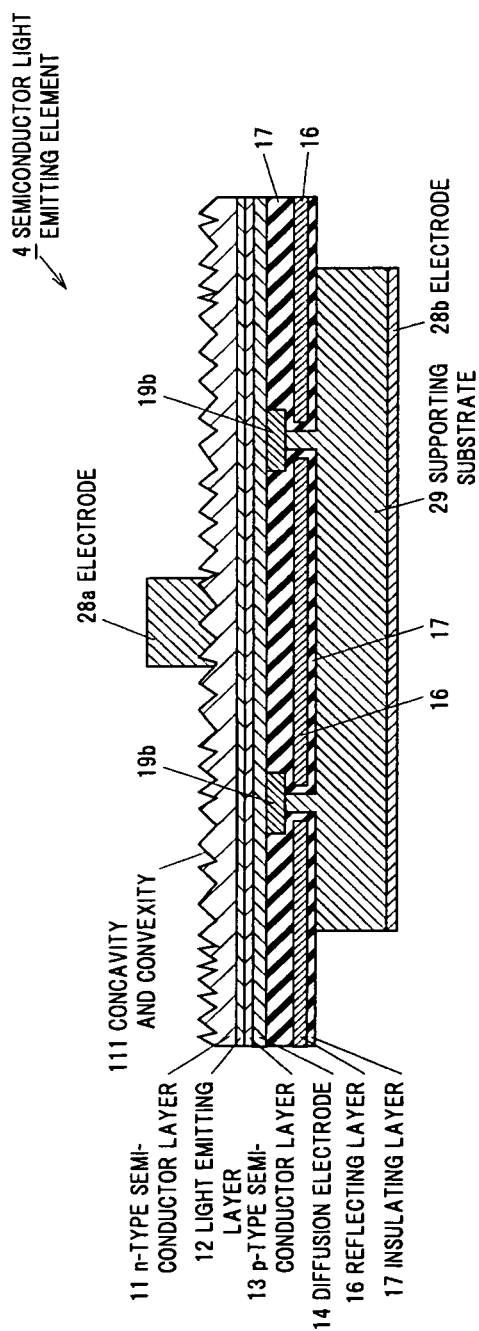
FIG. 7 is a vertical cross-sectional view schematically showing a semiconductor light emitting element according to a fourth embodiment of the invention.

FIG. 7 is a vertical cross-sectional view schematically showing a semiconductor light emitting element 4 according to the fourth embodiment of the invention. In the semiconductor light emitting element 4, a translucent substrate corresponding to the substrate 10 of the semiconductor light emitting element 1 is removed, and the concavity and convexity 111 is formed on the exposed surface of the n-type semiconductor layer 11. The semiconductor light emitting element 4 has an electrode 28a formed on the surface of the n-type semiconductor layer 11 on which the concavity and convexity 111 is formed. In addition, the surface of the supporting substrate 29 is connected to the diffusion electrode 14 via the buffer electrodes 19b. The electrode 28b is formed on the surface of the supporting substrate 29. Further, the reflecting layer 16 can be formed directly on the diffusion electrode 14 without the insulating layer 17.

As shown in FIG. 7, it is preferable that the diffusion electrode 14 is formed on the whole surface of the p-type semiconductor layer 13. In addition, it is preferable that the supporting substrate 29 is connected to the diffusion electrode 14 at plural sites via a plurality of buffer electrodes 19b. Due to this, electrical current can be diffused more uniformly to the p-type semiconductor layer 13.

The electrode 28a has a multilayer structure formed of, for example, V/Al. The supporting substrate 29 is formed of a metal such as Cu, or a semiconductor containing p-type impurities such as Si, and has a conductive property. The electrode 28a has a multilayer structure formed of, for example, Ti/Ni/Au.

First, the n-type semiconductor layer 11, the light emitting layer 12, the p-type semiconductor layer 13, the diffusion electrode 14, the buffer electrode 19b, the reflecting layer 16 and the insulating layer 17 are formed on the substrate 10, and then the surface of the supporting substrate 29 is joined in such a manner that the surface is connected to the buffer electrode 19b, the electrode 28b being preliminarily formed on an opposite surface to the surface of the supporting substrate 29. After that, the substrate 10 is separated from the n-type semiconductor layer 11 by using Laser Lift Off (LLO) method. In addition, the exposed surface of the n-type semiconductor layer 11 is immersed in a KOH aqueous solution, thereby the concavity and convexity 111 is formed on the surface of the n-type semiconductor layer 11. After that, the electrode 28a is formed on the n-type semiconductor layer 11.

According to the fourth embodiment, it is not needed to remove a part of the light emitting layer 12 in order to connect the electrodes to the n-type semiconductor layer 11, so that the amount of light extracted can be increased.

Further, in each of the above-mentioned embodiments, the semiconductor multilayer structure can have a configuration that the n-type layer and the p-type layer are reversed. Namely, a configuration that a p-type semiconductor layer is formed instead of the n-type semiconductor layer 11, and an n-type semiconductor layer is formed instead of the p-type semiconductor layer 13 can be adopted.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor light emitting element, comprising: a semiconductor multilayer structure comprising a first conductivity type layer, a second conductivity type layer, and a light emitting layer sandwiched between the first conductivity type layer and the second conductivity type layer; and
    a reflecting layer formed on the second conductivity type layer for reflecting the light emitted from the light emitting layer,
    wherein the light is extracted in a direction from the light emitting layer toward the first conductivity type layer,
    wherein an entire top surface of the first conductivity type layer is a concavo-convex region, said top surface of the first conductivity type layer being opposed to the light emitting layer, for changing a path of light,
    wherein at least a part of the reflecting layer is formed extending to a point above an edge of the first conductivity type layer such that the edge of the first conductivity type layer is in-line with an edge of the reflecting layer,
    wherein an outermost of the reflecting layer is not outside of the light emitting layer in a top view of the semiconductor light emitting element.

2. The semiconductor light emitting element according to claim 1, further comprising a translucent substrate that is in contact with the surface of the first conductivity type layer with the concavo-convex region formed thereon.

3. The semiconductor light emitting element according to claim 2, wherein at
    least a part of the semiconductor multilayer structure is formed extending to above an edge of the translucent substrate.

4. The semiconductor light emitting element according to claim 1, further comprising an insulating layer formed between the reflecting layer and the second conductivity type layer.

5. The semiconductor light emitting element according to claim 4, wherein a side surface of a part of the reflecting layer formed right above an edge of the first conductivity type layer is not covered with the insulating layer.

\* \* \* \* \*